United States Patent [19]

Noguchi et al.

[11] 3,933,488
[45] Jan. 20, 1976

[54] INFORMATION DISPLAY METHOD

[75] Inventors: Yasuhiro Noguchi; Hisatake Ono; Tsutomu Sugisaki, all of Asaka, Japan

[73] Assignee: Fuji Photo Film Co., Ltd., Ashigara, Japan

[22] Filed: May 16, 1973

[21] Appl. No.: 361,004

[30] Foreign Application Priority Data

May 17, 1972 Japan............................ 47-48920

[52] U.S. Cl................. 96/1 R; 96/45.1; 96/50; 96/82; 250/458; 427/14; 427/15; 427/56; 427/157
[51] Int. Cl.²......................................... G03G 13/06
[58] Field of Search............... 117/1.7, 36.2, 36.8; 340/173 CH; 252/188.3 CL; 96/45.1, 82, 90 PC, 1, 50; 346/74 E, 1; 250/458; 427/14, 15, 56, 157

[56] References Cited
UNITED STATES PATENTS

| | | | |
|---|---|---|---|
| 2,297,691 | 10/1942 | Carlson............................ 117/17.5 |
| 2,629,956 | 3/1953 | Switzer............................ 117/1.7 |
| 2,817,767 | 12/1957 | Rosenthal............................ 96/1.4 |
| 3,363,556 | 1/1968 | Shely et al............................ 101/469 |
| 3,375,176 | 3/1968 | Humiston..................... 252/188.3 CL |
| 3,392,123 | 7/1968 | Winberg..................... 252/188.3 CL |
| 3,510,336 | 5/1970 | Figov et al............................ 117/1.7 |
| 3,511,612 | 5/1970 | Kennerly et al............. 252/188.3 CL |
| 3,525,630 | 8/1970 | Phillips............................ 117/1.7 |
| 3,557,233 | 1/1971 | Zweig..................... 252/188.3 CL |
| 3,669,891 | 6/1972 | Greenwood et al........ 252/188.3 CL |
| 3,677,957 | 7/1972 | Maulding..................... 252/188.3 CL |
| 3,728,270 | 4/1973 | Bens et al................... 252/188.3 CL |
| 3,753,919 | 8/1973 | Cline........................ 252/188.3 CL |
| 3,840,385 | 10/1974 | Yoshida........................... 117/17.5 |

Primary Examiner—Bernard D. Pianalto
Attorney, Agent, or Firm—Sughrue, Rothwell, Mion, Zinn & Macpeak

[57] ABSTRACT

An information display method comprising forming an image of a chemiluminescent component on a support according to information to be recorded and placing the support bearing the image of the material in an atmosphere capable of effecting the chemiluminescence of the material to thereby display the image based on a difference in luminance.

24 Claims, 3 Drawing Figures

INFORMATION DISPLAY METHOD

BACKGROUND OF THE INVENTION

1. Field of the Invention

The present invention relates to an information display system and more particularly it relates to an information display system utilizing chemiluminescence. More practically, the invention relates to an information display system which comprises fixing an image of a chemiluminescent component on a support based on information to be recorded, and placing the support in an atmosphere capable of causing the chemiluminescence of the material of the image, whereby chemiluminescence is caused only at the image of the material to display the image based on differences in luminance.

2. Description of the Prior Art

Display techniques which are a means of recording events and communicating originated in ancient times. As compared with the rough marks formed in ancient times, visual display techniques have greatly progressed. With hand-written characters and various modern prints and photographs which are used as a mode of display, the information is discriminated by a visual process based on the difference in optical absorptions of reflected light or transmitted light.

When incandescent glow lamps were invented, the application of these lamps to display means was attempted. One such application is where luminous elements are arranged in a lattice to provide a matrix-type display device, and various electric display boards or panels have been provided. In this case, the information is seen by as a difference in the luminance of the luminescent materials.

With the rapid progress of electronics, cathode ray tubes utilizing the luminance of inorganic fluorescent materials were invented, and widely utilized for converting various electric signals into light. The above-mentioned matrix-type display device gives a display plane as an assembly of points, while the display plane from a cathode ray tube is essentially the tube plane itself, which gives a high resolving power and good fidelity. However, since the fluorescent surface of an ordinary cathode ray tube has a decay property (the signals or images on the fluorescent surface varnish in a short period of time), it is necessary to repeatedly conduct one dimensional scanning of an electron beam for ordinary display. Furthermore, in a cathode ray tube it is difficult to reduce the depth thereof, and in particular in the case of desiring an indication of a large area, the depth becomes deep, which is a fault of cathode ray tubes.

SUMMARY OF THE INVENTION

An object of this invention is, therefore, to provide an improved information display system based on a difference in luminance.

A second object of this invention is to provide an information display system of short depth and high resolving power.

A third object of this invention is to provide a method of making such an information display system.

A fourth object of this invention is to provide a simple information display system.

Other important objects of this invention as well as the features and advantages of this invention will become apparent from the descriptions set forth below and the accompanying drawings.

According to the present invention, there is provided an information display system which comprises imagewise fixing a chemiluminescent component on a support according to information to be recorded and simultaneously with fixing or after fixing, placing the image of the material in an atmosphere capable of causing chemiluminescence of the image form of the information display system, providing a visible image based on differences in luminance.

Thus, by the method of this invention an information display system which radiates imagewise on a support is provided. For this purpose, at least one component of a group of chemiluminescent components consisting of the stoichimetrically necessary chemiluminescent components, and accelerators or inhibitors if desired, for the chemiluminescent reaction(s) are imagewise fixed on a support. The final display is based on the presence of the chemiluminescent component or on the difference in the amount of the component when a composition containing the remaining materials necessary for the chemiluminescence is brought into contact with the image of the material to cause chemiluminescence selectively at only the material image portions.

In the present specification, a chemiluminescent component can be viewed as a multicomponent chemiluminescence system where one or more components essential to the chemiluminescence reaction are lacking. Such a material may be viewed as a potentially chemiluminescent system which becomes chemiluminescent upon adding the missing component(s).

DETAILED DESCRIPTION OF THE INVENTION

Figure 1:
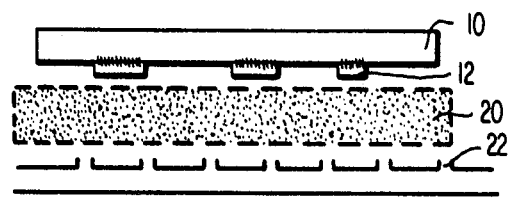
FIGS. 1-3 illustrate various embodiments of chemiluminescent systems in accordance with the present invention.

As chemiluminescent components chemiluminescent materials, oxidizing agents, accelerators, luminance inhibitors, pH adjusting agents, organic fluorescence reagents, solvents, etc., may be blended according to the requirements of the desired chemiluminescent system. An accelerator, a fluorescent reagent, a solvent and, a pH adjusting agent are optional in many systems.

The mandatory components of all chemiluminescent systems of this invention comprise a latent chemiluminescent redox combination. In this redox combination, however, it is sometimes not entirely correct to call an organic compound and an oxidizing agent a latent chemiluminescent material and an activator, respectively. This is because while in general the oxidized form of the organic material becomes luminescent in the excited state, some cases are also encountered in which the oxidizing agent plays the roll of the latent chemiluminescent material since a main component of a latent chemiluminescent material is oxygen molecules in the excited state which are generated from an oxidizing agent as an activator. Both such concepts are within the present invention.

An accelerator, a luminance inhibitor, a pH adjusting agent, an organic fluorescent agent and a solvent are all optional in the sense that many systems chemiluminesce without such materials. However, there are cases, for instance, in which when an accelerator is not present chemiluminescence does not substantially occur, and therefore in such a system the accelerator component is not optional. These will be apparent from the specification, as will those cases where other optional components become mandatory.

The use of a luminance inhibitor is not more practical than that of an accelerator. When an image is formed by an inhibitor, a dark image is obtained in the light background, and while useful in theory, practical applications are few.

However, imagewise chemiluminescence is realized when a strong retarder image is formed on a support which is uniformly coated with a less effective accelerator.

Chemiluminescence in this specification includes all light emitted with chemical reactions proceeding at temperatures below about 500°C. The term "light" in this invention means electromagnetic radiation having a wave length(s) in the range of about 350 about 800 m$\mu$.

A chemiluminescent reaction is exothermic, and a part of the energy formed with the progress of the chemical reaction is converted into heat. However, in chemiluminescence, a reaction product which is in the electron excited state is produced, and when the product transists back to the ground state, it emits energy in the form of electromagnetic radiation. Chemiluminescent reactions effective in the present invention are chemical reactions radiating near ultraviolet rays, visible rays, and near infrared rays which are in the wave length region of ca.350 to ca.800m$\mu$.

Chemiluminescent reactions are substantially all oxidation reactions. Many compounds are known as chemiluminescent materials, but particularly effective compounds in this invention are generally organic compounds. There are many organic chemiluminescent materials useful in this invention and some are described in, for instance, Karl Dietrich Gundermann; "Chemilumineszenez organischer Verbindungen" (published by Springer Verlag A. G., in 1968) and V. Ya. Shlyapintokh; "Chemiluminescence Techniques in Chemical Reactions" (English translation from the Russian text published by Consultants Bereau Co., in 1968).

Other chemiluminescent materials and oxidizing agents useful in this invention are described in U.S. Pat. Nos. 3,366,572; 3,597,362; 3,539,794; and 3,584,211; British Pat. Nos. 1,067,607 and 1,163,436; etc.

Typical examples of such chemiluminescent materials are luminol, lophine, pyrogallol, lucigene, indole, riboflavine, oxysilicone, diphenylanthracene, isbenzofuran, derivatives of these compounds, and similar compounds. It is well known that these chemiluminescent materials radiate when they are chemically oxidized or electrolytically oxidized.

Another group of compounds used in this invention are the so called "biological luminescent materials". Examples of such materials are specific basic materials in living organisms such as firefly luciferin and Cyridina hilgendorfii luciferin. They emit radiation when oxidized by enzymes by the catalytic action of an enzyme called luciferase. Hence, the term "chemiluminescent material" in this invention includes biological luminescent materials.

It is known that some chemiluminescent materials emit radiation by a neutralization reaction, and such materials can also be used in this invention. For example, there are alkali metal oxides which emit radiations by the neutralization reaction with concentrated acid. See the article by M. Trauk "Zeitschrift fur Physikalische Chemie", volume 53, No. 1 (1905), discussing such systems in detail.

Among the above-mentioned chemiluminescent materials, luminols are particularly effective in this invention. Further, very effective luminols are compounds represented by the general formula I

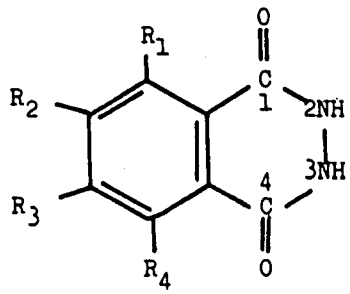

wherein $R_1$ and $R_2$ each represents a hydrogen atom, an amino group, an alkyl-substituted amino group, an acetamido group, a nitro group, a hydroxyl group, a halogen atom, or an alkylmercapto group, one of $R_1$ and $R_2$ being, however, a hydrogen atom, and $R_3$ and $R_4$ represent a hydrogen atom, a methoxy group, or a halogen atom. The alkyl group on the amino group preferably contains 1 to 3 carbon atoms, and the alkyl chain in the alkylmercapto group preferably contains 1 to 20 carbon atoms. The latter is exemplified by the group $C_{10}H_{21}S$.

Specific examples of compounds represented by general formula I are illustrated below. They are all known as chemiluminescent materials.

1. 5-amino-2,3-dihydro-1,4-phthalazine (luminol),
2. 2,3-dihydro-1,4-phthalazinedione,
3. 5-acetamido-2,3-dihydro-1,4-phthalazinedione,
4. 6-amino-2,3-dihydro-phthalazinedione,
5. 6-chloro-2,3-dihydro-phthalazinedione,
6. 6,7-dichloro-phthalazinedione,
7. 5-hydroxy-phthalazinedione,
8. 5-methylamino-phthalazinedone,
9. 5-nitro-phthalazinedione,
10. 6-nitro-phthalazinedione,
11. 5-amino-8-methoxy-phthalazinedione,
12. 6-amino-phthalazinedione,
13. 6-dimethylamino-phthalazinedione,
14. 5-propioneamino-phthalazinedione,
15. 6-dodecylthio-phthalazinedione.

The lophines used in this invention may be represented by general formula II

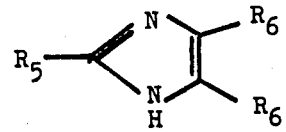

wherein $R_5$ and $R_6$ each represents a phenyl group, a naphthyl group, an anthranyl group, a pyridyl group, or a substituted phenyl group. The substituents of the substituted phenyl group are a lower alkyl group, a lower alkoxyl group, a dialkylamino group, a hydroxyl group, a nitro group, a carboxyl group, a halogen atom and the like. All the alkyl moieties in the above formula most preferably contain 1 to 3 carbon atoms.

The compounds represented by general formula II have been reported by, e.g., E. H. White and M. J. Harding in "Photochemistry and Photobiology", Vol.

4, 1129(1965) and by G. E. Pholbrook et al., "ibid", Vol. 4, 1175(1965). Among the above-mentioned compounds, the lophine derivative having an electron donating substituent at the p-position of the phenyl group, such as, e.g., dimethylamino, methoxy, methyl, ethyl and t-butyl groups [(p-dimethyl-aminophenol)-4,5-dianicylimidazole, is particularly effective in this invention] are preferred.

The oxidation luminescence of luminols has been highly investigated, and detailed reaction mechanisms are known.

According to White et al., at chemilunescence luminol requires a stoichiometric amount of oxygen and emits a stoichiometric amount of nitrogen. The main product is aminophthalic acid as shown by the following formula.

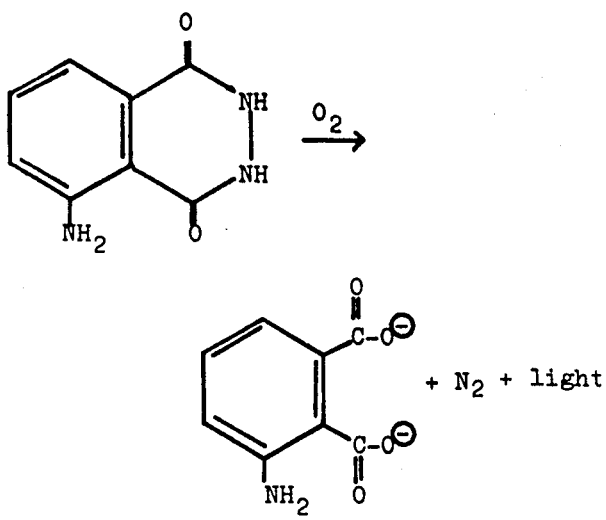

The term oxidizing agent in this invention means an oxidizing agent in a narrow sense capable of supplying stoichiometrically necessary oxygen for the oxidation luminescent reaction, and includes gaseous, liquid, and solid compounds capable of supplying oxygen. Practical examples of such oxidizing agents are oxygen, ozone, air, organic and inorganic hydroperoxides, peroxides, persulfates, etc. Among those compounds oxygen, air, hydrogen peroxide, hydroperoxide, and a persulfate are particularly effective. As specific examples of persulfates there are $K_2S_2O_8$, $Na_2S_2O_8$, $(NH_4)_2S_2O_8$, $[(CH_3)_4]_2S_2O_8$, etc. Other useful materials include methyl hydroxide, and tetralin hydroxide.

The accelerators are compounds having a function of promoting the oxidation luminescence other than the abovementioned oxidizing agents. They can be readily detected by testing a solution of a specific chemiluminescent material to see whether the added compound has the function of promoting the chemiluminescence of the chemiluminescent material or of retarding or inhibiting the chemiluminescence, as compared to a control.

It is known that many metal salts and coordination compounds thereof are effective as such accelerators, and the action of such an accelerator has been utilized in the quantitative or qualitative analyses of metal salts in the field of analytic chemistry.

Metal salts of metals belonging to Groups IVa, Va, VIa, VIIa, VIII, Ib, IIb, IIIb, and IVb of the periodic table are effective. Among these metals, iron, cobalt, and nickel belonging to the so-called iron group in the fourth period of Group VIII, and compounds of other elements in the fourth periodic group are particularly effective. When the element of the metal salt has valences higher-valent compounds are generally more effective and higher valent materials are preferred. Typical examples of such compounds are ferric nitrate, cobalt nitrate, and titanium chloride. Furthermore, inorganic coordination compounds such as $[CO(NH_3)_6]Cl_3$ and $K_3[Fe(CN)_6]$ in which the above-mentioned inorganic metal salt molecule or inorganic metal salt ion is an electron donor and an organic coordination compound such as tris-(acetylacetate)cobalt-(III), in which the organic molecule is an electron donor, are also particularly effective.

An oligomer or a polymer having, as a ligand material, a structural unit capable of being an electron donor in the main chain or a side chain thereof can also be used in this invention. As metal coordination compounds having such a high molecular weight ligand, there can be illustrated the cobalt(III)-poly(4-vinyl-pyridine) complex. Those compounds can be prepared by the ligand substitution reaction of low molecular weight coordination compounds and polymer ligands.

Many organic coordination compounds in which organic molecules are the electron donor are effective as an accelerator in this invention. When such an accelerator promotes the occurence of oxidation luminescence in an alkaline solution, [the apparent pH is preferably about 8 to about 10] a compound having a large total stability constant as an organic coordination compound and having a low solubility in the alkaline solution is desirable. A compound which is too soluble is undesirable since in such a case the organic coordination compound is dissolved in the luminescent solution from the image, which causes blots of the luminescent image. Detailed measurement results of the stability constant of the solubility of organic coordination compounds are summerized in various texts. Examples of such texts are "Metal Chelate", Vol. I, Vol. II, and Vol. III by Sakaguchi and Ueno (published by Nankodo Book Co. in 1965, 1966, and 1967, respectively, and "Stability Constants of Metal-ion Complexes", 2nd edition, (18664) by L. G Sillen and A. E. Mertell.

As the ligands of the organic coordination compounds earlier discursed effective in this invention, there can illustrated ethylenediamine tetraacetic acid, trinitrotriacetic acid, 1,2-diaminocyclohexane-tetraacetic acid, N-oxyethyl ethylenediamine traiacetic acid, ethyleneglycol bis(β-aminoethyl ether) tetraacetic acid, ethylenediamine tetrapropionic acid, and porphyrins such as hemin.

The solvent in this invention is a medium in which the chemiluminescence reaction takes place and which is chemically inert and is a liquid at room temperature. In the present invention, water, an organic solvent, and a mixed solvent of water and an organic solvent miscible with water may be used as the solvent. However, the intensity of the chemiluminescent spectra depends upon the kind of solvent, and in general, an aprotic solvent of high polarity, most preferably about, 30 or greater at room temperature, such as dimethyl sulfoxide, dioxane, etc., insure high luminescent intensity. In a specific case, a compound such as acetanilide which is a solid at room temperature can be used as the solvent in this invention by melting it.

In case of causing chemiluminescence of luminol and lophine, good luminescent efficiency is obtained when oxidation is in an alkaline solution, with an apparent pH of the more than 8 being required. It is known that in the case of the oxidation luminescence of luminol, the quantum efficiency of the fluorescence of the aminophthalic acid which is the main product becomes higher in an alkaline state. Also, there is the theory that the anion of luminol is a reaction seed, and it is considered that such an anion is related to the progress of the reaction and the quantum efficiency of the luminescence.

The term "pH adjusting agent" in this invention means an acid or alkaline compound, such as an inorganic or organic basic compound, added to increase the total quantum yield of the oxidation luminance. The pH adjusting agent for the oxidation luminance of luminol, lophine, etc., is a basic compound and inorganic and organic basic compounds can be effectively used. Examples of very effective compounds are potassium hydroxide, sodium hydroxide, sodium carbonate, pyridine, morpholine, etc.

In the case of employing a biological luminescent system in this invention, there is also an optimum pH region for effecting the luminescence reaction, and thus a proper buffer solution can be used as a pH adjusting agent. The preferred pH is about 8 to about 14 and any solution having a pH within the above mentioned range is preferably employed as the buffer solution.

The chemiluminescent composition in this invention can contain an organic fluorescent reagent, if desired. Practical examples are a polycyclic aromatic compound such as anthracene and phenanthrene and an organic fluorescence reagent such as fluorecein and Rose Bengale. However, although such an organic fluorescent material is a component effective for improving the quantum efficiency of chemiluminescence and changing the wave lengths of luminescence, it is not a necessary component for causing the chemiluminescence in this invention.

One would use a fluorescent reagent when chemiluminescence from the mandatory redox system is extremely weak. In this case, it is considered that although the chemical reaction necessary for chemiluminescence proceeds at a sufficiently rapid speed, energy generated in the system is consumed to be converted into heat, not light. It is also considered that when a fluorescent reagent is added to the system, energy generated therein transfers to the reagent to excited the reagent, whereby luminescence takes place.

Additional examples of fluorescent reagents are fluorescent hydrocarbons such as pyrene, 1,2-benzopyrene, anthracene and penylene and fluorescent dyes such as Acridine Orange, Fluorescein, Eosine, Erythrocin, Rhodamine B and Methylene Blue.

The information display system of this invention will now be explained by referring to the case of using luminol as the chemiluminescent material. In case of using luminol as the chemiluminescent material, the following five materials contribute or relate to the chemiluminescence.

A: Chemiluminescent material
B: Oxidizing agent
C: Accelerator
D: pH Adjusting agent
E: Solvent The chemiluminescence occurs in an excellent manner when all five components are present, and any condition can be selected such that if one component is removed from the five components, substantially no chemiluminescence occurs even if the other four components are present.

Practically speaking, an aqueous solution containing $10^{-3}$ M/liter of luminol, $10^{-3}$ M/liter of hydrogen peroxide, and having a pH of 13 causes substantially no chemiluminescence, but when the solution is brought into contact with the image of a material containing an accelerator, chemiluminescence occurs.

In the present invention, a display which radiates image wise can be obtained by forming an image of at least one of the above-mentioned five components on a support and then contacting the image of the material with the luminescent composition containing the remaining component(s) among the five components.

Examples of combinations of the component or components contained in the image of material formed on a support and of the components of the luminescent composition corresponding to the image material are shown in Table I, although they are only illustrative.

In the present invention, of course, it is possible that one component or less than all components can be uniformly distributed over the surface of a support and the remaining luminescent component(s) brought into imagewise contact therewith.

Table I

| | Image material on support | Luminescent composition |
|---|---|---|
| 1 | C | A + B + D + E |
| 2 | A | B + C + D + E |
| 3 | B + C | A + D + E |
| 4 | D | A + B + C + E |
| 5 | A + B + C + D + E* | heating to melt E |

*In the combination 5, a solvent which is solid at room temperature is used as solvent E.

In the present invention, when an image of a component or components selected from the five components is formed on a support, a binder, ordinarily a resinous material which is inactive to the chemiluminescent reaction, can be present if desired. As a binder component, any binder used in the field can be employed. The binder can be hydrophilic or hydrophobic, and is transparent, semitransparent or transluscent. There can be employed natural film-forming substances, cellulose derivatives, synthetic resins and the like, such as gelatin, agar-agar, starch, phthalated gelatin, polyvinyl butyral, cellulose acetate butyrate, cellulose acetate propionate, polymethyl methacrylate, polyvinylpyrrolidone, polystyrene, ethyl cellulose, polyvinyl chloride, chlorinated rubber, polyisobutylene, butadiene-styrene copolymers, vinyl/chloride-vinyl acetate copolymers, cellulose acetate, polyacrylamide, cellulose acetate phthalate, benzyl cellulose, polyvinyl alcohol and the like.

It is desirable in the case of employing such a binder to disperse the material or materials relating to the chemiluminescence in the binder in the molecular state or as fine particles. In this case, the component or components contributing to the chemiluminescence are present, in general, in a thin film or layer of the binder and the film or the layer is supported on a self-supporting material such as paper, plastic, or metal.

The addition of an accelerator or a fluorescent dye to a latent chemiluminescent material is usually effective in small amount in order to obtain a discernable image. For example, about $10^{-6}$ to about $10^{-1}$ mole per mole of the latent material, respectively. The amount of a solvent is optional.

In an information display system of the invention, the image of the chemiluminescent component can be formed on the support by a mechanical method, a printing method or a photographic method.

As examples of photographic methods, there is a silver salt photographic method, an electrostatic photographic method, a heat-sensitive photographic method and other various photographic methods based on photochemical reactions of organic compounds (photochemical methods).

Among those methods, in the case of imagewise forming on the support the chemiluminescent component together with a binder, a composition consisting of the chemiluminescent component and the binder may be imagewise formed on the support or an image of only the binder can first be formed on the support and then the chemiluminescent component can be chemically or physically bonded to the image of the binder to form an image of the material. Also, for forming the image of the material, both an addition method and a subtraction method can be effectively used.

Typical examples of forming the chemiluminescent component image are illustrated below, but it will be understood by a person skilled in the art that other methods can be utilized in this invention as a matter of course.

In one embodiment of the mechanical method, a chemiluminescent component image is formed by typewriting the image using a typewriter ribon containing the auxiliary oxidizing agent. Alternatively, a chemiluminescent component image is formed on a support by forming an image of a binder on a water resisting support with a solution containing the binder (such as a warm aqueous solution of gelatin) and, after setting the image by cooling, immersing the support in a solution containing an organic coordination compound as heretofore described as an accelerator.

In the case of employing a mechanical method, the technique of encapsulation well known in the field of pressure-sensitive copying papers can be utilized. In this case, a solution prepared by dissolving the chemiluminescent component in a chemically inactive high-boiling solvent is encapsulated to form microcapsules, and they are coated on a support such as paper. According to this embodiment, many sheets of images can be prepared simply and at the same time. Encapsulation methods and the various applications thereof are described in detail in Asaji Kondo "Microcapsule", published by Nikkan Kogyo Shinbun Sha in 1970.

In the printing method, the chemiluminescent component image can be formed by many different printing systems such as relief printing, intaglio printing, screen printing, stencil printing, collotype printing and lithographic printing by incorporating the chemiluminescent component in the printing ink.

For forming the chemiluminescent component image by an electrostatic photographic method, an electrostatic latent image is formed on a photoconductive recording layer or on an insulating layer by any known method and then the latent image is developed by a toner prepared by pulverizing the chemiluminescent component or a mixture of the chemiluminescent component and a binder. Specific practical examples of the photoconductive layer are a vacuum evaporated amorphous selenium layer as described in U.S. Pat. Nos. 2,745,327 and 2,753,278, the zinc oxide-resin dispersion layer as described in U.S. Pat. Nos. 3,052,239 and 3,052,540, the inorganic photoductive powder-resin dispersion layer as described in U.S. Pat. No. 3,212,006 and the organic photoconductor as described in U.S. Pat. No. 3,114,633 and Japanese Pat. No. 813/1961.

Various methods of forming latent images are known. For instance, the latent image can be formed by the Carlson method in which the above-mentioned insulating layer is uniformly charged and then the layer is imagewise exposed or brought into contact with a conductive plate to form the latent image, by the Kalman method in which the photoconductive layer is first imagewise exposed and then charged, by the method utilizing a photoelectromotive force, by the method in which an image is formed by thermal radiation on a conductive layer before or after static charging and the reduction in resistance at the heated portions is utilized, by the method in which an electrode having applied thereto electric potential is applied to an insulating layer, or the method in which light or electric potential corresponding to a signal is applied by scanning the recording face of an insulating layer. Furthermore, changes of electrical properties by pressure may be also utilized.

The development of the electrostatic latent image can be conducted by the various methods well known in the field of electrophotography. If an image having fine particles is desired, it is desirable to employ a liquid development or a Power-Cloud development.

In the case of forming a chemiluminescent component image using a heat-sensitive photographic method, an original having varying absorption for infrared rays is closely brought into contact with a recording material transmitting infrared rays, and then the recording material is subjected to transmitted exposure or reflected exposure of light which includes infrared rays. In this case, thermal energy is provided as a pattern to the portions of the heat-sensitive layer corresponding to the infrared absorbing portions of the original, and an image is formed by a thermochemical change or thermophysical change. Various heat-sensitive photographic methods have already been developed and some of them have succeeded in commercial use. The heat-sensitive photographic methods have been summarily reported by J. Kosar in the 9th Paragraph of "Light-Sensitive Systems" published by John Wiley & Sons Company in 1965. Further, a list of literature relating to heat-sensitive reproduction is summerized with a list of other image-forming methods in "Photographic Science and Engineering", Vol. 14, 438–442(1970), and techniques which can be utilized in this invention are included in this list.

Furthermore, the chemiluminescent component can be incorporated in a thermo-sensitive layer by combining the heat softenable aforementioned heat fusible compound with a chemically inert binder, and from the thermo-sensitive layer a chemiluminescent component image of can be formed on a support by thermal transfer.

As the physical changes employed in the thermo-sensitive photographic method embodiment of this invention, there can be illustrated, in addition to the phase transition between vapour, liquid, and solid, a thermal softening of a vitrified material, a thermal shrinkage or thermal expansion of a polymer, and the rupture of microcapsules.

As the chemical changes employed in the heat-sensitive photographic method embodiment, there are thermochemical changes and the decomposition of the chemiluminescent component.

In the heat-resisting reproduction method, a transmission exposure or reflection exposure by contact printing can be employed.

Also, in the photochemical method which will be explained below, a pattern can be formed by enlargements other than contact printing.

As the silver salt photographic method used in the formation of the chemiluminescent component image, there are various methods well known in the photographic field, such as the tanning development of silver halide, etc. For forming images on non-silver salt photosensitive materials by a photochemical method, various methods have been developed and they are summerized by J. Kosar in "Light-Sensitive", published by John Wiley & Sons Co. 1965. Among the methods described in the above text one typical method involves the use of a bichromate colloid, another involves the photolinkage of a derivative of cinnamic acid, and another the photohardening of a vinyl compound or an unsaturated polyester. They are all used for photoengraving and photoresist work in the photographic field.

In the case of forming the image of material using a photochemical method, there are (1) a method utilizing a photochemical reaction of a compound used as a binder and (2) a method which applies the photochemical reaction of the chemiluminescent component.

In the aforesaid method (1), a photosensitive layer such as a photosensitive polymer is formed on a support and a relief image is formed on the support utilizing the difference in physical properties between photohardened or photodecomposed exposed portions and unexposed portions and unexposed portion. In this case, the chemiluminescent component can be preliminarily incorporated in the photosensitive layer or may be, after forming the relief image, bonded to the relief image to form the image of the chemiluminescent component.

For forming the image of the chemiluminescent component by the aforesaid method (2), the chemiluminescent component is coated uniformly on a support and is decomposed or converted into another material by the chemical change resulting from subjecting it to imagewise exposure. Thereafter, by treating the surface of the support with the chemiluminescent composition, different luminance intensities are provided to the image-exposed portions and to the unexposed portions.

When a coordination compound is used as the auxiliary oxidizing agent, the image of the coordination compound can be formed on a support by utilizing the photochemical reaction of the coordination compound itself. Many photochemical reactions of coordination compounds have been reported and they are summarized by V. Balzani and V. Carassiti in "Photochemistry of Coordination Compounds" published by Academic Press, 1970. If any coordination compound undergoes a photochemical reaction to form a different compound and two kinds of compounds have different accelerating actions or different inhibiting actions for the chemiluminescence reaction before and after the photochemical reaction, they can be used in this invention. In this case, information can be displayed by forming a photosensitive layer containing the coordination compound on a support, irradiating the photosensitive layer with light based on the information to form a pattern of a material having different promoting power for the chemiluminescence reaction between irradiated portions and non-irradiated portions, and then bringing the pattern into a state capable of causing the chemiluminescence reaction.

When the image of the chemiluminescent component is formed utilizing a photochemical method, the reaction can be caused not only by visible rays but also by electromagnetic radiation such as gamma-rays, X-rays, ultraviolet rays, microwaves, radio waves, etc., as well as thermal radiation and particle beams. For instance, an electron beam can be scanned onto the surface of a material which can be hardened by electron irradiation according to a video signal in a timed system to imagewise harden the material, whereby an image of the material is formed. Also, since a laser or an electron discharge can also be applied in a spot of a small area as with an electron beam, by scanning while modulating the intensity according to a signal, a change such as a chemical reaction, decomposition or modification can be caused on the support.

In order to selectively irradiate only the image of the material formed on the support, the image of the chemiluminescent component is brought into contact with the chemiluminescent composition. When the luminescent composition is a solution, the complete material image on the support can be immersed in the solution, the solution can be coated on the image of the material on the support, or, alternatively, the solution can be sprayed onto the image of the material. In this case, the solution may be a concentrated solution. Also, a soft porous material impregnated with the luminescent solution can be applied to the image of the chemiluminescent component under pressure.

For preparing a concentrated solution of the luminescent composition, any natural or synthetic polymer soluble in the chemiluminescent composition and inactive thereto can be used as a viscosity increasing agent, for example, gelatin, starch or agar-agar, as natural polymers.

The amount of the chemiluminescent composition solution used depends upon the system of the chemiluminescent composition used and the concentration of the reagent. However, usually an amount necessary for developing diazo-type copying paper, that is to say, the amount necessary for wetting the surface of the photosensitive material, is sufficient. For example, it is sufficient to immerse in a treating liquid in an amount of about 5 to about 30% by weight based on the weight of the paper base. Accordingly, the luminescent process of this invention may be referred to as a semi-dry process.

The information display system formed by the present invention can be recorded on a recording material. For instance, by applying a photosensitive paper onto the front surface of the display of this invention, a hard copy can be obtained. Further, by using a photographing apparatus having a lens system, reduced or magnified copies can be obtained from the display. Furthermore, the character display edited for photo-typesetting in printing can be photographed on a silver salt photographic material, and then a print can be formed by photo-engraving using the photographed photosensitive material.

The display of the information display system of the present invention can be, if desired, amplified by an electrical circuit, e.g., television, or can be stored by means of an electronic device. Such a temporary storage can be conducted by a PEP-400 VIDEO/GRAPHIC STORAGE TERMINAL made by Princeton Electronic Products Co. in the U.S.A.

Among the various methods of forming the image of the chemiluminescent component on a support, the photographic method is particularly effective since by the photographic method patterns of a more precise and complicated nature can be formed than by the mechanical method or the printing method.

As the chemiluminescent component forming an image on a support, it is more preferred to select a compound which catalytically promotes or inhibits the chemiluminescence reaction and which is not significantly consumed than to use a compound which is readily stoichiometrically consumed.

In the information display system employing the oxidation luminescence of luminol, it is preferred to use the ions or organic or inorganic complex salts of a transition metal of the fourth periodic group as the material for the image since the action of the accelerator tends to have a catalytic effect.

The invention will now be further illustrated by referring to the accompanying drawings.

FIG. 1 is a schematic view showing an embodiment of this invention wherein chemiluminescence is caused using a soft porous material containing the chemiluminescent composition. Thus, the image of the chemiluminescent component 12 formed on a support 10 can be radiated by contacting it with a felt 20 impregnated with a luminescent solution. In this case, a gas such as oxygen as the oxidizing agent or a liquid material contributing to the chemiluminescent reaction can be supplied to the material image through the porous felt from the nozzles 22 disposed behind the felt 20. To facilitate the observation of the radiation or luminance, it is desirable to use a black felt.

Figure 2:
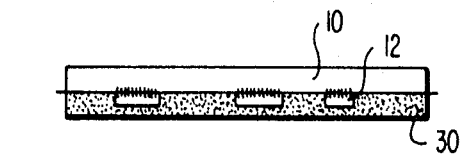

FIG. 2 is a schematic view showing another embodiment of this invention wherein the luminescence reaction is caused by applying a concentrated luminescent solution. That is to say, the luminance is caused by applying a luminescent solution 30 to a image of chemiluminescent component 12 formed on a support 10. In this case, a viscosity increasing agent is added, if desired, to the luminescent solution to form a thick, dense solution thereof. Alternatively, the luminescent solution can be applied to the chemiluminescent component by spraying. In this case, also, the intensity of luminescence can be increased, if desired, by placing the total luminescence system in an oxygen atmosphere or by blowing air onto the material image.

Figure 3:
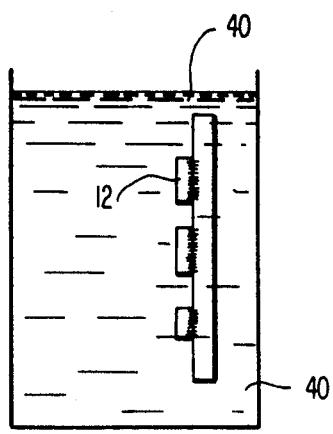

FIG. 3 is another embodiment of this invention where the luminance is caused by immersing the chemiluminescent component image 12 formed on a support 10 in a luminescent solution 40 and a material causing chemiluminescence is supplied, if necessary, to the luminescent solution, i.e., the material contributing to the luminance is applied only if the solution itself does not contribute to the luminescence.

The information display system of this invention is simple and the device can be minaturized, which makes it possible to provide a portable display device. Also, according to this invention it is possible to display complicated signals and characters and further it is possible to use arbitrary patterns as a character display or graphic display.

According to the present invention, an inexpensive information display system having a storage function is provided. The image of the material fixed on a support according to the information to be displayed can be stored or preserved and at a desired time the image can be radiated. The display by this invention can be used in the observation, broadcasting, television, and information industries.

According to the present invention, information can be seen by a difference in luminance, and thus illuminating light which is necessary for reading information based on ordinary optical absorption is unnecessary. Therefore, if the information display system of this invention is applied to a device for reading optical characters, a light source for illumination becomes unnecessary and thus the display device is quite simplified.

Furthermore, in the display of this invention the duration of luminescence is quite long, and the luminescence can be maintained over several hours.

The display method of this invention will now be illustrated by the following examples, but the invention is not to be construed as limited to the examples.

Unless otherwise indicated, all thicknesses are dry thicknesses.

EXAMPLE 1

This example illustrates a method in which characters are written on a paper by hand using an ink containing an accellerator and a fluorescent agent, and then characters are radiated (caused to radiate) by a semidry system.

The ink was prepared by dissolving 0.5 g of potassium ferricyanide (accelerator) and 2.2 mg. of Rhodamine B (fluorescent agent) in 50 ml of water. Characters were written on a high quality paper with the ink using a pen and dried. A chemiluminescent composition was prepared as follows. 5 ml of a solution prepared by dissolving $10^{-2}$ mol of luminol in a 1 : 1 volume mixture of dimethyl sulfoxide and water was mixed with 20 ml. of an aqueous 0.03% hydrogen peroxide solution. No luminance was observed when the chemiluminescent solution was placed in the dark.

A sponge impregnated with the aforesaid chemiluminescent composition was bought into contact with the high quality paper having the image of the material to wet the paper therewith, whereby the characters showed a luminance which could be seen with eyes which had not adapted to the darkness. The characters could thus be read clearly.

EXAMPLE 2

The same procedure as in Example 1 was followed except that ferric nitrate, titanium chloride, ferric sulfate, cobalt nitrate, lead acetate or vanadium dichloride was used in place of potassium ferricyanide. The hand-written characters sould be observed in the dark in each case.

EXAMPLE 3

This examples shows an embodiment in which an image of the material is formed utilizing a photosensitive layer containing an accelerator and then the image is caused to radiate.

10 g of Gosenol GL-05H (trade name for polyvinyl alcohol made by Nippon Gosei Kagaku Kogyo K. K.) was dissolved in 100 ml of water. 0.1 g of potassium bichromate and 10 mg of an acetylacetonate cobalt-(III) complex salt (accelerator) were dissolved in 5 ml of the polyvinyl alcohol solution thus prepared (polyvinyl alcohol and potassium bichromate are representative photosensitive materials where exposed areas are hardened). The photosensitive composition containing the accelerator for the chemiluminescence was applied by means of rod to a polyethylene terephthalate film having a gelatin subbing coat and dried in a dry box through which warm air at 50°C was circulated.

A transparent positive bearing a line image as is ordinarily used in the manufacture of printing plates was placed on the photosensitive film thus prepared and the film was exposed from the side of the polyethylene terephthalate film for 200 seconds to a mercury lamp (250 watt high pressure mercury lamp) at a distance of 40 cm.

By washing the exposed photosensitive film with water, the unhardened portions corresponding to unexposed portions were washed off. Then the film was washed for 20 minutes in running water and dried to give a relief image which was an image of material containing the accelerator for chemiluminescence.

Then, a chemiluminescent composition was prepared by mixing 20 ml of a solution prepared by dissolving $10^{-2}$ mol/liter of luminol in aqueous 20% dimethyl formamide solution, and adding 40 ml of an aqueous 0.1 mol $Na_2SO_3$ solution and 100 ml of an aqueous 0.03% $H_2O_2$ solution.

This composition gave no luminance in the dark but when the polyethylene terephthalate film having the above-mentioned image of material on it was immersed in the solution, only the image portions chemiluminesced. The luminescence continued over 10 minutes.

EXAMPLE 4

This example shows an embodiment of the display method in which a binder of a photohardenable photosensitive material is formed into an image, an accelerator is bonded to the image to provide an image of material, the then the image is chemiluminesced by a viscous processing solution.

That is to say, 8 g of gelatin was added to 40 ml of water and then 1.5 g of potassium bichromate was dissolved therein for providing photosensitivity. The bichromate colloid thus prepared was applied by means of a rod to a polyethylene terephthalate film having a gelatin subbing coat under a safety lamp, and after setting by a blast of cold air, the coating was dried by allowing it to stand overnight at room temperature. As in Example 3, the photosensitive film thus prepared was exposed behind a film for the manufacture of printing plates for 4 minutes, and then the film was developed with running water at 35°C for few minutes to provide a photo-hardened gelatin image. The polyethylene terephthalate film having the image was immersed in an aqueous 2% cobalt nitrate solution for about 10 minutes and then dried.

Separately, a viscous solution was prepared by mixing a chemiluminescent composition consisting of $10^{-3}$ mol/liter of luminol, $10^{-4}$ mol/liter of hydrogen peroxide, and 0.1 normal sodium hydroxide solution and an equal volume of an aqueous 20% solution of Gosenol GL-05H, (trade name of polyvinyl alcohol made by Nippon Gosei Kagaku Kogyo K. K.) as a viscosity increasing agent. When the viscous treating solution thus prepared was applied onto the image of the material formed above by means of a doctor blade, the characters were visible (radiated) for a number of minutes in the dark.

EXAMPLE 5

When the same procedure as in Example 4 was followed except that the polyethylene terephthalate film having the gelatin relief formed as in Example 4 was immersed in an aqueous 1% chloroaurate solution for one hour and then dried, a bright luminescent image in the dark was obtained.

Furthermore, when the image of the material immersed in the aqueous chloroaurate solution followed by drying was allowed to stand for 30 days at room temperature and then the luminescent composition was applied thereto, luminescence as above was also observed.

EXAMPLE 6

The same procedure as in Example 4 was followed except that a luminescent composition was prepared by using a polyvinyl alcohol solution having the same concentration, but saturated with Rhodamine B in place of the polyvinyl alcohol solution in the same example. When the chemiluminscent spectra thus formed was observed by means of a fluorophosphorophotometer, a sensitized luminance of a maximum luminance wave length at 580 m$\mu$ was observed in addition to the intrinsic luminescent spectrum of luminol having a maximum luminescent wave length at 420 m$\mu$.

EXAMPLE 7

This example shows an embodiment in which an image with an accelerator is formed by using a thermoplastic photopolymerizable material, and then the image of the material is displayed.

The thermoplastic photopolymerizable composition was prepared as follows. After dissolving 10 g of cellulose acetate butyrate (half-second butyrate) in 240 ml of methyl ethyl ketone, 15.4 g of pentaerythritol triacrylate, 200 mg of phenatholene quinone, and 70ml of p-methoxyphenol were successively dissolved therein. The photopolymerizable composition thus prepared was applied on a polyethylene terephthalate film having a thickness of 100 microns by means of a rod. The dry thickness of the layer was about 2.5 microns. A polyethylene terephthalate film having a thickness of about 30 microns was bonded onto the photopolymerizable layer, thus forming an oxygen-protective layer. The protective layer was exposed behind a positive transparent original for photoengraving to a high pressure mercury lamp (400 watts) for 5 seconds at a distance of 30 cm. After exposure, the protective layer was stripped from the photopolymerizable layer and the film having the photopolymerizable layer was placed on a hot plate heated to 110°C to heat it from the base side. Then, fine powdered cobalt(III) acetylacetonate was applied onto the whole surface of the photopolymerizable layer and air was flown onto the surface, whereby the image of the powder corresponding to the transparent original was obtained since only the unexposed portions of the layer were viscous. When the luminescent composition as in Example 4 was applied to the image, imagelike radiation was clearly observed.

EXAMPLE 8

The same procedure as in Example 7 was followed except that fine powders of a copper EDTA compex salt, nickel acetate, chromium(III) acetylacetonate, iron(III) acetylacetonate, manganese (II) acetylacetonate or manganese(III) acetylacetonate were used in place of the fine powders of cobalt(III) acetylacetonate. Similar results to those in Example 7 were obtained.

While the invention has been described in detail and with reference to specific embodiments thereof, it will be apparent to one skilled in the art that various changes and modifications can be made therein without departing from the spirit and scope thereof.

What we claim is:

1. An information display method wherein a component chemiluminescent system is caused to chemiluminesce on a support which comprises forming an image on a support of the components of the chemiluminescent system lacking at least one essential component to cause chemiluminescence by incorporating said components lacking said one essential component in a heat-sensitive layer on a recording material capable of transmitting infrared rays, bringing said layer in contact with an original having varying absorption for infrared rays, subjecting said layer to transmitted exposure or reflected exposure of light including infra-red rays in imagewise fashion from said original and removing exposed or non-exposed portions of said layer to form an image, and contacting said image with the lacking component or components of the chemiluminesent system to cause said image to chemiluminesce selectively to display information on the support based on a difference in luminescence between the chemiluminescent image and the non-image portion.

2. The method as set forth in claim 1 wherein said chemilumiscent system comprises a chemiluminescent material and an oxidizing agent which chemiluminesces the same.

3. The method of claim 2 wherein the chemiluminescent system further comprises an accelerater agent, a pH adjusting agent and a solvent.

4. The method as set forth in claim 3 wherein said chemiluminescent material is luminol, lophine, pyrogallol, lucigene, indole, riboflavin, oxysilicone, diphenyl anthracene, isobenzofuran or derivatives thereof.

5. The method as set forth in claim 3 wherein said chemiluminescent material is a biological luminescent material.

6. The method as set forth in claim 1 wherein the step of contacting includes placing the image of the material in an atmosphere containing said lacking component or components of the chemiluminescent system causing chemiluminescence by applying to the image a soft porous material impregnated with said lacking component or components of the chemiluminescent system causing chemiluminescence, thereby causing chemiluminescence as a result of contact of the image and the atmosphere.

7. The method as set forth in claim 1 wherein the step of contacting includes placing the image of the material in an atmosphere containing said lacking component or components of the chemiluminescent system causing chemiluminescence by applying onto the image a composition containing said lacking component or components of the chemiluminescent system causing chemiluminescence as the result of contact of the image and the composition.

8. The method as set forth in claim 1 wherein the step of contacting includes placing the image of the material in an atmosphere containing said lacking component or components of the chemiluminescent system causing chemiluminescence by immersing the image in a composition containing said lacking component or components of the chemiluminescent system causing chemiluminescence as the result of contact of the image and the composition.

9. An information display method wherein a component chemiluminescent system is caused to chemiluminescence on a support which comprises forming an image on a support of the components of the chemiluminescent system lacking at least one essential component to cause chemiluminescence by forming a layer comprising said components lacking at least one essential component and silver salt photosensitive material on said support, imagewise exposing said layer and developing said layer to form an image and contacting said image with the lacking component or components of the chemiluminescent system to cause said image to chemiluminescence selectively to display information on the support based on a difference in luminescence between the chemiluminescent image and the non-image portion.

10. The method as set forth in claim 9 wherein said chemiluminescent system comprises a chemiluminescent material and an oxidizing agent which chemiluminesces the same.

11. The method of claim 9 wherein the chemiluminescent system further comprises an accelerater agent, a pH adjusting agent and a solvent.

12. The method as set forth in claim 9 wherein said chemiluminescent material is luminol, lophine, pyrogallol, lucigene, indole, riboflavin, oxysilicone, diphenyl anthracene, isobenzofuran or derivatives thereof.

13. The method as set forth in claim 9 wherein said chemiluminescent material is a biological luminescent material.

14. The method as set forth in claim 9 wherein the step of contacting includes placing the image of the material in an atmosphere containing said lacking component or components of chemiluminescent system causing chemiluminescence by applying to the image a soft porous material containing the atmosphere containing said lacking component or components of the chemiluminescent system causing chemiluminescence, thereby causing chemiluminescence as a result of contact of the image and the atmosphere.

15. The method as set forth in claim 9 wherein the step of contacting includes placing the image of the material in an atmosphere containing said lacking component or components of the chemiluminescent system causing chemiluminescence by applying onto the image a composition containing said lacking component or components of the chemiluminescent system causing chemiluminescence as the result of contact of the image and the composition.

16. The method as set forth in claim 9 wherein the step of contacting includes placing the image of the material in an atmosphere containing said lacking component or components of the chemiluminescent system causing chemiluminescence by immersing the image in a composition containing said lacking component or components of the chemiluminescent system causing chemiluminescence as the result of contact of the image and the composition.

17. An information display method wherein a component chemiluminescent system is caused to chemiluminescence on a support which comprises forming an image on a support of the components of the chemiluminescent system lacking at least one essential component to cause chemiluminescence by forming an electrostatic latent image on a photoconductive recording layer or on an insulating layer on said support, developing the latent image with a toner comprising said components of the chemiluminescent system lacking at least said one essential component and contacting said image with the lacking component or components of the chemiluminescent system to cause said image to chemiluminescence selectively to display information on the support based on a difference in luminescence between the chemiluminscent image and the non-image portion.

18. The method as set forth in claim 17 wherein said chemiluminescent system comprises a chemiluminescent material and an oxidizing agent which chemiluminesces the same.

19. The method as set forth in claim 17 wherein the chemiluminescent system futher comprises an accelerater agent, a pH adjusting agent and a solvent.

20. The method as set forth in claim 17 wherein said chemiluminescent material is luminol, lophine, pyrogallol, lucigene, indole, riboflavin, oxysilicone, diphenyl anthracene, isobenzofuran or derivatives thereof.

21. The method as set forth in claim 17 wherein said chemiluminescent material is a biological luminescent material.

22. The method as set forth in claim 17 wherein the step of contacting includes placing the image of the material in an atmosphere containing said lacking component or components of chemiluminescent system causing chemiluminescence by applying to the image a soft porous material containing the atmosphere containing said lacking component or components of the chemiluminscent system causing chemiluminescence, thereby causing chemiluminescence as a result of contact of the image and the atmosphere.

23. The method as set forth in claim 17 wherein the step of contacting includes placing the image of the material in an atmosphere containing said lacking component or components of the chemiluminescent system causing chemiluminescence by applying onto the image a composition containing said lacking component or components of the chemiluminescent system causing chemiluminescence as the result of contact of the image and the composition.

24. The method as set forth in claim 17 wherein the step of contacting includes placing the image of the material in an atmosphere containing said lacking component or components of the chemiluminescent system causing chemiluminescence by immersing the image in a composition containing said lacking component or components of the chemiluminescent system causing chemiluminescence as the result of contact of the image and the composition.

* * * * *